United States Patent
Becker et al.

(10) Patent No.: US 12,287,588 B2
(45) Date of Patent: Apr. 29, 2025

(54) METHOD FOR OPERATING AN EUV LITHOGRAPHY APPARATUS, AND EUV LITHOGRAPHY APPARATUS

(71) Applicant: Carl Zeiss SMT GmbH, Oberkochen (DE)

(72) Inventors: Moritz Becker, Aalen (DE); Dirk Heinrich Ehm, Beckingen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 235 days.

(21) Appl. No.: 17/970,850

(22) Filed: Oct. 21, 2022

(65) Prior Publication Data

US 2023/0041588 A1   Feb. 9, 2023

Related U.S. Application Data

(63) Continuation of application No. PCT/EP2021/060104, filed on Apr. 19, 2021.

(30) Foreign Application Priority Data

Apr. 21, 2020   (DE) ..................... 10 2020 205 047.3

(51) Int. Cl.
  *G03F 7/20*   (2006.01)
  *G02B 5/08*   (2006.01)
  (Continued)

(52) U.S. Cl.
  CPC ....... *G03F 7/70916* (2013.01); *G02B 5/0891* (2013.01); *G03F 7/70033* (2013.01);
  (Continued)

(58) Field of Classification Search
  CPC ............... G02B 5/0891; G03F 7/70033; G03F 7/70916; G03F 7/70925; G03F 7/70958; G21K 1/062
  See application file for complete search history.

(56) References Cited

U.S. PATENT DOCUMENTS

| 7,911,598 B2 | 3/2011 | Kraus et al. |
| 8,149,378 B2 | 4/2012 | Morishima et al. |
| (Continued) | | |

FOREIGN PATENT DOCUMENTS

| DE | 102011079451 A1 | 8/2012 |
| DE | 102016225701 A1 | 3/2017 |
| (Continued) | | |

OTHER PUBLICATIONS

English translation of WO 2004/099878 A1 (Year: 2004).*
(Continued)

*Primary Examiner* — Mark R Gaworecki
(74) *Attorney, Agent, or Firm* — Edell, Shapiro & Finnan, LLC

(57) ABSTRACT

A method for operating an EUV lithography apparatus (1) with at least one vacuum housing (27) for at least one reflective optical element (12) includes operating the EUV lithography apparatus in an exposure operating mode (B), in which EUV radiation (5) is radiated into the vacuum housing, wherein a reducing plasma is generated at a surface (12a) of the reflective optical element in response to an interaction of the EUV radiation with a residual gas present in the vacuum housing. After an exposure pause, in which no EUV radiation is radiated into the vacuum housing, and before renewed operation of the EUV lithography apparatus in the exposure operating mode (B), the EUV lithography apparatus is operated in a recovery operating mode, in which oxidized contaminants at the surface of the reflective optical element are reduced in order to recover a transmission of the EUV lithography apparatus before the exposure pause.

21 Claims, 3 Drawing Sheets

(51) Int. Cl.
    *G03F 7/00*           (2006.01)
    *G21K 1/06*           (2006.01)

(52) U.S. Cl.
    CPC ...... *G03F 7/70925* (2013.01); *G03F 7/70958* (2013.01); *G21K 1/062* (2013.01)

(56) References Cited

U.S. PATENT DOCUMENTS

| | | |
|---|---|---|
| 2005/0281958 A1 | 12/2005 | Walton et al. |
| 2006/0208649 A1 | 12/2006 | Rueger et al. |
| 2007/0196773 A1 | 8/2007 | Weigel et al. |
| 2007/0285643 A1 | 12/2007 | Wedowski et al. |
| 2008/0088810 A1 | 4/2008 | Huh et al. |
| 2010/0034349 A1 | 2/2010 | Kraus et al. |
| 2011/0279799 A1 | 11/2011 | Singer et al. |
| 2012/0243258 A1 | 9/2012 | Park |
| 2012/0250144 A1 | 10/2012 | Ehm et al. |
| 2019/0243258 A1 | 8/2019 | Ament et al. |
| 2020/0142327 A1 | 5/2020 | Roozeboom et al. |
| 2020/0183292 A1 | 6/2020 | Becker et al. |

FOREIGN PATENT DOCUMENTS

| | | | |
|---|---|---|---|
| DE | 102017211539 A1 | 1/2019 | |
| DE | 102021202770 A1 | 3/2022 | |
| JP | 2005244015 A | 9/2005 | |
| TW | 200425802 A | 11/2004 | |
| TW | 200732847 A | 9/2007 | |
| TW | 201907241 A | 2/2019 | |
| TW | 201921134 A | 6/2019 | |
| WO | 2004081503 A2 | 9/2004 | |
| WO | WO-2004099878 A2 * | 11/2004 | ......... G03F 7/70916 |
| WO | 2008034582 A2 | 3/2008 | |
| WO | WO-2013041569 A1 * | 3/2013 | ............ B82Y 10/00 |

OTHER PUBLICATIONS

International Search Report, PCT/EP2021/060104, Jul. 22, 2021, 3 pages.
German Office Action with English translation, Application No. 10 2020 205 047.3, Oct. 7, 2020, 8 pages.
TW Office Action with English translation, Application No. TW110114112, Jan. 6, 2025, 17 pages.
TW Search Report, Application No. TW110114112, Apr. 21, 2020, 1 page.

* cited by examiner

METHOD FOR OPERATING AN EUV LITHOGRAPHY APPARATUS, AND EUV LITHOGRAPHY APPARATUS

CROSS-REFERENCE TO RELATED APPLICATION

This is a Continuation of International Application PCT/EP2021/060104, which has an international filing date of Apr. 19, 2021, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2020 205 047.3 filed on Apr. 21, 2020.

FIELD OF THE INVENTION

The invention relates to a method for operating an EUV lithography apparatus comprising at least one vacuum housing, in which at least one reflective optical element is arranged. The method comprises: operating the EUV lithography apparatus in an exposure operating mode, in which EUV radiation is radiated into the vacuum housing, wherein a reducing plasma is generated at a surface of the reflective optical element as a result of an interaction of the EUV radiation with a residual gas present in the vacuum housing. The invention also relates to an EUV lithography apparatus, comprising: at least one vacuum housing, in which at least one reflective optical element is arranged, and a control device configured to operate the EUV lithography apparatus in an exposure operating mode, in which EUV radiation is radiated into the vacuum housing, wherein a reducing plasma is generated at a surface of the reflective optical element as a result of an interaction of the EUV radiation with a residual gas present in the vacuum housing.

BACKGROUND

The EUV lithography apparatus (EUV scanner) is used for the exposure of a substrate (wafer) and is operated with extreme ultraviolet (EU) radiation at an operating wavelength in the EUV wavelength range of between approximately 5 nm and approximately 30 nm. The operating wavelength can be 13.5 nm or 6.8 nm, for example. On account of the low transmission of all gases at wavelengths in the region of 13.5 nm—or else at 6.8 nm—it is necessary to operate the optical elements of an EUV lithography apparatus in a vacuum environment. On account of the low transmission of practically all solid-state materials at these wavelengths, reflective optical elements (e.g. mirrors) are generally used in an EUV lithography apparatus.

In order to avoid contamination or for cleaning purposes, an EUV lithography apparatus is typically not operated in a high vacuum, but rather at a working pressure of approximately 5 Pa in the vacuum housing, generally with molecular hydrogen as residual gas or as purge gas. The residual gas contained in the vacuum housing can also contain gases other than hydrogen, e.g. Ar, He, and slight oxygen and/or nitrogen admixtures, and $H_2O$ and carbon, in particular in the form of $CO_2$ and in the form of hydrocarbons (CnHm). During operation of the EUV lithography apparatus, contaminants or contaminating substances can accumulate on the surfaces of the reflective optical elements, for example contaminations that contain hydrocarbons. Such contaminations reduce the transmission of the EUV lithography apparatus and thus the wafer throughput. A number of possibilities are known for cleaning the surfaces of reflective optical elements of an EUV lithography apparatus in order to increase the transmission.

US 2008/0088810 A1 discloses providing an EUV lithography apparatus with a light source system which generates an exposure beam during the exposure of a substrate and generates a cleaning beam having a longer wavelength than the exposure beam, for example a very ultraviolet (VUV) beam, during the cleaning of at least one optical element. The radiation generated by a light source can be filtered for this purpose. The cleaning beam serves to convert molecular oxygen fed to the EUV lithography apparatus into activated oxygen, e.g. ozone, in order to oxidize a carbon layer that has deposited on the surface of the optical element.

JP 2005244015 A discloses, for the purpose of removing a carbon layer or the like that has deposited on an optical element of an EUV lithography apparatus, interrupting the exposure operating mode, withdrawing a mask used for the exposure, and radiating cleaning light from a cleaning light source, e.g. a xenon lamp, along an optical path corresponding to the exposure beam path into a projection system of the EUV lithography apparatus.

US 2010/0034349 A1 discloses cleaning components in the interior of an EUV lithography apparatus by igniting a plasma adjacent to a respective component. Electrodes adapted to the shape of the component to be cleaned are used for this purpose. The plasma can be ignited if a limit value for the concentration of a contaminating substance is exceeded. The plasma used for cleaning can be a hydrogen plasma.

US 2012/0243258 A1 has disclosed a projection exposure apparatus having at least one partial volume closed off from the surroundings. The partial volume contains a gas from which a plasma can be formed. Conditioning elements for conditioning the plasma, in particular for neutralizing the plasma, are formed in the partial volume.

U.S. Pat. No. 8,149,378 B2 describes a cleaning device for a lithography apparatus that images a structure on a mask onto a substrate via an optical element using first radiation. The cleaning device cleans the optical element using second radiation at a second wavelength. A cleaning mask can be used for cleaning the optical element using the second radiation.

US 2007/0285643 A1 describes a method for operating an EUV lithography apparatus in an operation mode, a cleaning mode or a repair mode. The cleaning mode is activated if a monitoring parameter for the contamination state of an optical element exceeds a limit value. In the cleaning mode, photocleaning can be carried out using radiation at a wavelength in the deep ultraviolet (DUV) or EUV wavelength range and/or the partial pressures of reducing and oxidizing species can be modified depending on the respective contamination. In the cleaning mode, a cleaning mask can be used which replaces the mask used for the exposure and which can have structures in order to spectrally modify the incident radiation.

It has been found that upon renewed operation after an exposure pause in which the EUV light source is switched off, EUV lithography apparatuses can have a significant power loss at the wafer.

SUMMARY

It is an object of the invention to provide a method for operating an EUV lithography apparatus and also an EUV lithography apparatus in which a transmission loss during a renewed exposure operating mode after an operating pause is avoided or at least reduced.

According to one formulation of the invention, this object is achieved by a method of the type mentioned in the introduction in which after an exposure pause, in which no EUV radiation is radiated into the vacuum housing, and before renewed operation of the EUV lithography apparatus in the exposure operating mode, the EUV lithography apparatus is operated in a recovery operating mode, in which oxidized contaminants at the surface of the reflective optical element are reduced in order to recover—at least partly, ideally completely—a transmission of the EUV lithography apparatus before the exposure pause. Typically, the contaminants or at least some of the contaminants (or types of contaminants) that are reduced to the non-oxidized state are not removed from the surface of the optical element during the recovery operating mode.

The inventors have recognized that a major reason for the power loss after an operating pause is a transmission loss attributable to a reduction of the reflectivity of the mirrors of the EUV lithography apparatus that arises during the operating pause. The reduction of the reflectivity of the mirrors is attributable to the oxidation of contaminants at the (reflective) surface of a respective reflective optical element during the operating pause. The inventors have discovered that many contaminants that have accumulated at the surface of the reflective optical element bring about a lower reflectivity loss of the reflective optical element in the non-oxidized state compared with in the oxidized state of the contaminants.

(Possibly partial) oxidation of the contaminants that had deposited on the surface of the reflective optical element occurred in the operating pause, for example because the vacuum in which the reflective optical elements are operated in the exposure operating mode is breached. Even without the vacuum breach or the ventilation of the EUV lithography apparatus, the discontinuation of the reducing plasma increases the probability of a respective surface of a reflective optical element coming into contact with oxidizing substances, for example with oxygen or water in the residual gas, during the operating pause and oxidizing in the process.

After a time duration, which can possibly be of the order of magnitude of a number of days in the case of the mirrors of the projection system, a large portion of the transmission of the EUV lithography apparatus lost in the exposure pause is recovered in the exposure operating mode. However, the wafer throughput of the EUV lithography apparatus also decreases during this period of time. Moreover, misinterpretations in the determination of the total transmission of the EUV lithography apparatus can occur during this period of time since the reflectivity of the mirrors increases during this period of time on account of the contaminants that have not yet been completely reduced.

In accordance with one aspect of the invention, the present application therefore proposes operating the EUV lithography apparatus in a recovery operating mode before the renewed exposure operating mode, in which recovery operating mode a transmission loss of the EUV lithography apparatus during the exposure pause is reduced and ideally the transmission of the EUV lithography apparatus that existed before the exposure pause is recovered. The complete recovery of the transmission that existed before the exposure pause is generally not possible, but a large portion of the transmission loss during standby operation or the exposure pause can be recovered in the recovery operating mode.

As indicated above, in the recovery operating mode, the oxidized contaminants at the surface of the reflective optical element are (chemically) reduced. However, all or at least some chemically reduced contaminants are typically not removed from the surface of the reflective optical element during the recovery operating mode and remain on the surface also during the renewed operation of the EUV lithography apparatus in the exposure operating mode. In fact, as will be explained below, some types of contaminants are deposited permanently on the surface of the optical element and are not (or cannot) be removed from the optical surface by the chemical reduction to the non-oxidized state that is performed in the recovery operating mode.

Although the EUV lithography apparatus is not available for the exposure operating mode during the recovery operating mode, the time duration of the recovery operating mode is generally significantly shorter than the time duration required to recover the transmission of the EUV lithography apparatus during the exposure operating mode: In the exposure operating mode, the transmission is substantially recovered by the reducing plasma generated at the surface of the reflective optical element with the EUV radiation required for the imaging of the mask. During the—comparatively short—recovery operating mode of the EUV lithography apparatus, the transmission can be recovered significantly faster than in the exposure operating mode since the (chemical) reduction of oxidized contaminants at the surface of the reflective optical element can be carried out significantly more effectively than in the exposure operating mode.

In one variant, at least one component which outgasses contaminants upon contact with the reducing plasma in the exposure operating mode is arranged in the vacuum housing, wherein the contaminants accumulate at the surface of the reflective optical element and are oxidized to oxidized contaminants during the exposure pause.

Although a reducing plasma, specifically a hydrogen plasma, is well suited to cleaning the surfaces of reflective optical elements, as a result of the hydrogen plasma solid compounds which contain in particular metals, e.g. tin, zinc, indium, phosphorus, magnesium, copper, ruthenium, and/or silicon, sulfur, etc., and which form at components provided in the vacuum housing, e.g. at soldered joints, can be converted to readily volatile hydrides by reduction. These hydride compounds can deposit on partial regions of the surfaces of the reflective optical elements and can no longer be removed from the latter, which results in a permanent reflection loss and, in association therewith, a permanent transmission loss of the EUV lithography apparatus. However, the provision of components which outgas contaminants upon contact with reducing plasma, for example with a hydrogen plasma, cannot be completely dispensed with, in principle, in the EUV lithography apparatus, and so a transmission loss of the EUV lithography apparatus which is attributable to the contaminants outgassed by the components described above cannot be completely avoided.

In contrast thereto, the transmission loss attributable to the oxidation of the contaminants described above, e.g. to $SiO_2$, . . . can be recovered for the most part in the recovery operating mode of the EUV lithography apparatus (see above). The recovery operating mode need not necessarily be followed directly by the exposure operating mode, rather a test operating mode of the EUV lithography apparatus can be effected between the recovery operating mode and the exposure operating mode. Oxidic contaminants formed at the surface of the reflective optical element in a manner different from that described above can also be reduced in the recovery operating mode in order to increase the reflectivity of the respective optical element.

In a further variant, in the recovery operating mode, in order to generate a reducing plasma in the vacuum housing, EUV radiation generated by an EUV light source is radiated into the vacuum housing. Radiating in EUV radiation during the recovery operating mode without additional measures or with the same parameters as in the exposure operating mode does not yet result in an acceleration of the recovery of the transmission. Rather, further measures are needed to increase the reducing effect of the plasma, some of which are described below.

In one variant, in the recovery operating mode radiation at at least one wavelength outside the EUV wavelength range is radiated into the vacuum housing. The EUV wavelength range is at wavelengths of between approximately 5 nm and approximately 30 nm. The wavelength of the radiation outside the EUV wavelength range is typically in the VUV wavelength range at wavelengths of more than 30 nm. Photoexcitation or absorption cross sections of many gas constituents contained in the residual gas are in particular at wavelengths of less than approximately 200 nm or optionally of less than approximately 100 nm. Radiating in radiation at these wavelengths can therefore result in intensified plasma formation. The radiation outside the EUV wavelength range can be generated for example with the aid of a light source provided for this purpose.

In one development of this variant, the radiation outside the EUV wavelength range is generated by an EUV light source of the EUV lithography apparatus. The EUV light source, particularly if it is embodied as a plasma light source, generates radiation not only in the EUV wavelength range but also at other wavelengths. In order to increase the proportion of the radiation generated by the EUV light source outside the EUV wavelength range ("out of band" radiation), optionally the laser radiation that serves for generating the EUV radiation in the EUV light source can be suitably adapted, for example by its beam profile, pre- or main-pulse energy and/or -pulse length in the recovery operating mode differing from the beam profile in the exposure operating mode, which influences the spectrum emitted by the EUV light source, such that more radiation is generated outside the EUV wavelength range than is the case in the exposure operating mode.

In a further variant, a mask used in the exposure operating mode is exchanged for a highly reflective mask in the recovery operating mode. Within the meaning of this application, a highly reflective mask is understood to mean a mask having a greater reflectivity for EUV radiation (and typically also for VUV radiation) than the mask used in the exposure operating mode. For this purpose, the highly reflective mask has no absorbing structures such as are required in the case of an exposure mask in order to image a structure onto the wafer. The highly reflective mask can have a reflectivity of more than 60%, for example, whereas the reflectivity is significantly lower in the case of an exposure mask (e.g. less than approximately 20%). Given a suitable design of the highly reflective mask, for example given suitable selection of the protective layer(s), a high VUV reflectivity can also be ensured. As a result of the mask being exchanged, more radiation passes into the projection system of the EUV lithography apparatus, which results in an intensified interaction of the EUV radiation with the residual gas and thus in intensified plasma formation. This is advantageous since in particular the reflective optical elements in the projection system, in the exposure operating mode, require a comparatively long time duration until their reflectivity is recovered for the most part after an exposure pause.

In a further variant, a power of the EUV light source in the recovery operating mode is increased relative to a power of the EUV light source in the exposure operating mode. In this way, too, the interaction of the EUV radiation with the residual gas can be increased and the plasma formation can thus be intensified.

In a further variant, in the exposure pause and/or in the recovery operating mode at least one partial pressure of a gas constituent of the residual gas that forms a reducing plasma, in particular a partial pressure of molecular hydrogen, is increased. In order to intensify the reducing effect of the plasma in the recovery operating mode, it is advantageous to increase the partial pressure of gas constituents of the residual gas which form a reducing plasma upon interaction with the EUV radiation. The partial pressure can be increased locally, i.e. in the region of the reflective optical element, or overall. In the first case, the gas constituent can be fed to a vacuum housing that forms a so-called "mini-environment" in the manner of a shield around the reflective optical element, as described in WO 2008/034582 A2, for example, which is incorporated by reference in its entirety in the content of this application. In the second case, the partial pressure of molecular hydrogen or of other gas constituents that form a reducing plasma, e.g. nitrogen, can be increased in a vacuum housing that surrounds the "mini-environment" or an illumination system and/or a projection system of the EUV lithography apparatus.

In a further variant, in the exposure pause and/or in the recovery operating mode at least one additional gas that preferably forms a reducing plasma or already has a reducing effect without plasma excitation, in particular carbon monoxide, is fed to the residual gas. With the additional gas, which usually does not form a gas constituent of the residual gas during the exposure operating mode, it is possible to alter the plasma chemistry in the vacuum housing and to accelerate the reduction of the oxidized contaminants at the surface. The additional gas can be, in particular, a gas that can have a more strongly reducing effect than hydrogen, for example carbon monoxide (CO).

In a further variant, the at least one reflective optical element is heated in the exposure pause and/or in the recovery operating mode. Heating the at least one optical element achieves the effect that chemical reactions proceed more rapidly at the surface of the reflective optical element. Therefore, the reduction of the oxidized contaminants at the surface of the reflective optical element can also be accelerated if the reflective optical element is heated to a temperature that is greater than the ambient temperature, e.g. greater than room temperature (22° C.).

In a further variant, in the exposure pause and/or in the recovery operating mode at least one plasma generating device is activated in order to generate reducing gas species, in particular in the form of hydrogen ions. Within the meaning of this application, a plasma generating device is understood to mean not only a device that generates ionized gas species, but also a device that generates—optionally exclusively—activated gas species, for example gases in an excited electron state or radical gas species. In the case of hydrogen, such reducing nonionic gas species are also referred to hereinafter as atomic hydrogen (H*) and can be generated for example by a cleaning head as described in WO 2008/034582 A2, cited further above. In the case of such a cleaning head, a purge gas, e.g. molecular hydrogen, is converted into an activated gas species by an activation device, which can comprise a heating wire (filament), for example. Other plasma generating devices, which generate for example a gas discharge in the residual gas of the vacuum housing, can also be used to generate mainly ionic gas species.

Depending on the type of oxidized contaminants, it can be more advantageous if mainly a flow of hydrogen ions or a flow of activated, nonionic gas species, e.g. in the form of atomic hydrogen, passes to the surface of the reflective optical element. By way of example, in the case of specific contaminants, e.g. in the case of $RuO_x$, it can be advantageous if substantially radical gas species pass to the surface of the reflective optical element. It is advantageous if the plasma generating device is configured to set the relative concentration of ionic gas species and of radical gas species at the surface of the reflective optical element.

In general it is advantageous if the reduction of the oxidized contaminants with the aid of the plasma generating device and the radiating of EUV radiation into the vacuum housing are effected simultaneously in order to recover the transmission of the EUV lithography apparatus in the shortest possible period of time and to cause the least possible effect on the availability of the EUV lithography apparatus for the user. However, radiating in EUV radiation and activating a plasma generating device can also be effected temporally successively during the recovery operating mode or it is possible to carry out only one of the two measures.

In a further variant, during the exposure pause and/or during the recovery operating mode at least one purge device is activated in order to reduce a partial pressure of oxidizing species in the region of the surface of the reflective optical element. During the exposure pause, in particular, it can be advantageous if there is fed to the surface of the reflective optical element an inert purge gas which contains no oxidizing species and/or a strongly reducing purge gas is admixed with it. Generally it is advantageous if, during the exposure pause, the proportion of oxidizing gas constituents of the purge gas that contain oxygen is minimized as much as possible, i.e. if e.g. the purge gas contains as little molecular oxygen as possible and as little water as possible.

In a further variant, during the exposure pause and/or during the recovery operating mode at least one pump device is activated in order to reduce the partial pressure of oxidizing species in the vacuum housing. The pump device can be e.g. an extraction device for extracting oxidizing species by suction from the region of the surface of the reflective optical element. The pump device can also be a cryopump for freezing out the oxidizing species in order to reduce the concentration and/or the partial pressure of the oxidizing species at times, typically during the exposure pause. Through these and other measures, as early as during the operating pause the oxidation of the contaminants at the surface of the reflective optical element can be counteracted and it can possibly be completely prevented.

In a further variant, the transmission of the EUV lithography apparatus is measured during the exposure operating mode and/or during the recovery operating mode. The measurement of the transmission of the EUV lithography apparatus is advantageous during the recovery operating mode, in particular, since in this way it is possible to determine when an optionally predefined value of the transmission of the EUV lithography apparatus at which the recovery operating mode is intended to be stopped and the exposure operating mode is intended to be resumed is reached. The measurement of the transmission of the EUV lithography apparatus in the recovery operating mode is expedient only for the case where EUV radiation is radiated into the vacuum housing in the recovery operating mode. The measurement of the transmission can be effected with the aid of suitable (power) sensors.

In a further variant, a time duration of the recovery operating mode is determined depending on a transmission loss of the EUV lithography apparatus during the exposure pause. The transmission loss in the exposure pause can be estimated on the basis of measurement values known in advance or determined experimentally, which optionally take account of the duration of the exposure pause, or can be known from a measurement of the transmission loss after one of the preceding exposure pauses without a recovery operating mode. The measurement values for the transmission loss can be stored for example in the form of a table in a control device of the EUV lithography apparatus. The time duration of the recovery operating mode is generally chosen to be all the longer, the greater the transmission loss in the exposure pause. The time duration of the recovery operating mode can optionally be further optimized, i.e. reduced, if in the measurement of the transmission loss that proportion is known which is attributable to the outgassing of contaminants as a result of the effect of a reducing plasma. The time duration of the recovery operating mode can also be reduced if the composition of the residual gas and the excitation are defined or optimized depending on the components that generate contaminants in the vicinity of a respective reflective optical element or depending on the type of the contaminant(s) at the surface of the reflective optical element.

Some of the measures described further above for increasing at times the reducing effect on the oxidized contaminants at the surface of the reflective optical element can optionally be maintained during the subsequent exposure operating mode as well.

A further aspect of the invention relates to an EUV lithography system of the type mentioned in the introduction in which the control device is configured, after an exposure pause, in which no EUV radiation is radiated into the vacuum housing, and before renewed operation of the EUV lithography apparatus in the exposure operating mode, to operate the EUV lithography apparatus in a recovery operating mode, in which oxidized contaminants at the surface of the reflective optical element are reduced in order in this way to recover a transmission of the EUV lithography apparatus before the exposure pause as completely as possible. For this purpose, the control device can initiate one or more of the measures described further above in association with the method, for example can radiate EUV radiation into the vacuum housing during the recovery operating mode, can activate a plasma generating device, etc.

Further features and advantages of the invention are evident from the following description of exemplary embodiments of the invention, with reference to the figures of the drawing, which show details essential to the invention, and from the claims. The individual features can each be implemented alone or in a plurality in any combination in one variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or analogous, or functionally identical or analogous, component parts.

Figure 1:
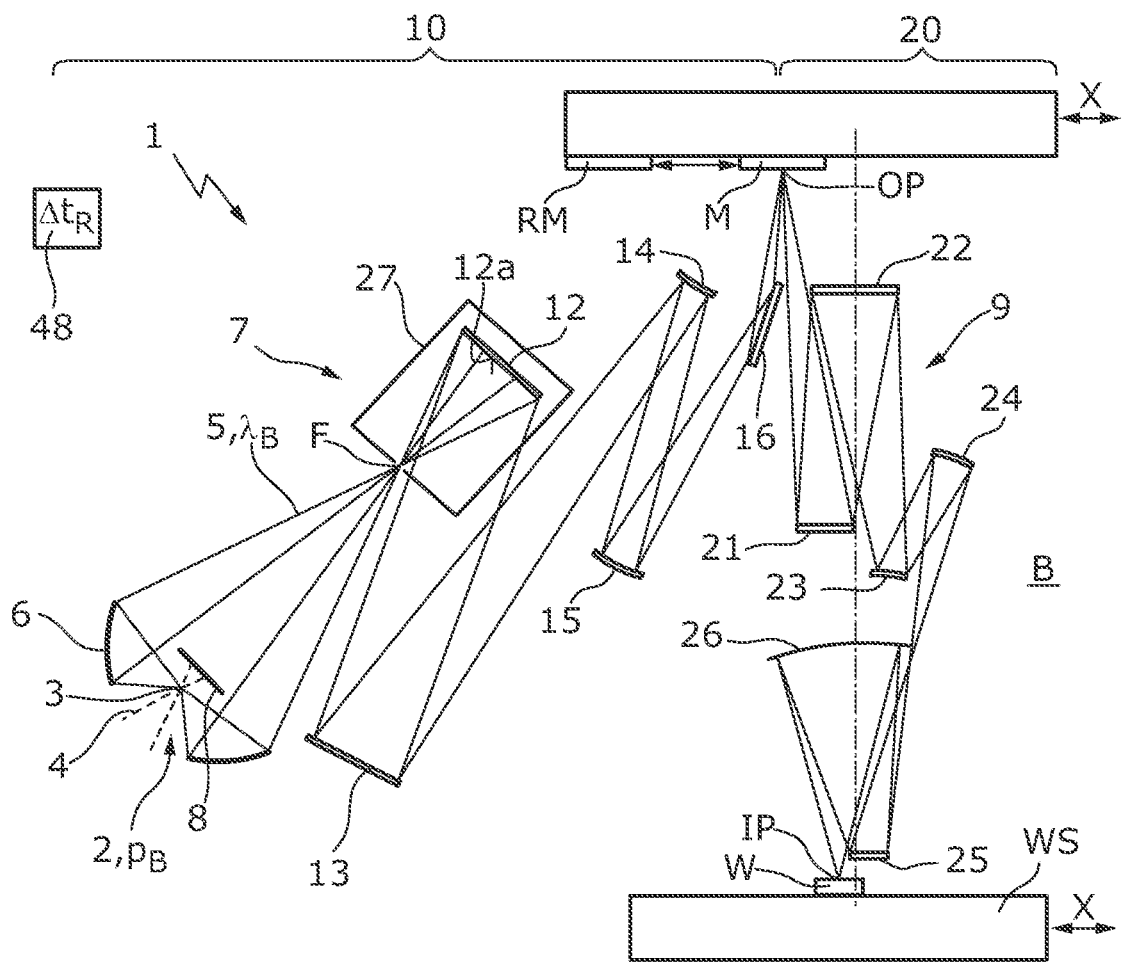
FIG. 1 shows a schematic illustration of an EUV lithography apparatus in the exposure operating mode.

FIG. 1 schematically shows the construction of an EUV lithography apparatus 1 in the form of a so-called wafer scanner. The EUV lithography apparatus 1 comprises an EUV light source 2 for generating EUV radiation 5 having a high energy density in the EUV wavelength range below 30 nm, in particular between approximately 5 nm and approximately 15 nm. In the example shown, the EUV light source 2 is embodied in the form of a plasma light source. The plasma light source 2 has a target 3 in the form of tin droplets, which is bombarded by a laser beam 4. The laser beam 4 is generated by a laser source (not illustrated in the figures), for example by a $CO_2$ laser. The laser beam 4 impinges on the target 3 and in the process generates a tin plasma that emits the EUV radiation 5. The EUV radiation 5 emanating from the tin plasma at the position of the target 3 is captured by a collector mirror 6, which focusses the EUV radiation 5 into an illumination beam path 7 and increases the energy density further in this way. In order to prevent the laser beam 4 from passing through the illumination beam path 7, the EUV lithography apparatus 1 comprises a beam trap 8 for the laser beam 4.

The illumination beam path 7 serves to illuminate a structured object M with an illumination system 10, which in the present example has five reflective optical elements 12 to 16 (mirrors).

The structured object M can be for example a reflective photomask, which has reflective and non-reflective, or at least less reflective, regions for producing at least one structure on the object M. Alternatively, the structured object M can be a plurality of micro-mirrors, which are arranged in a one-dimensional or multi-dimensional arrangement and which are optionally movable about at least one axis, in order to set the angle of incidence of the EUV radiation on the respective mirror.

The structured object M reflects part of the illumination beam path 7 and shapes a projection beam path 9, which carries the information about the structure of the structured object M and is radiated into a projection lens 20, which generates a projected image of the structured object M or of a respective partial region thereof on a substrate W. The substrate W, for example a wafer, comprises a semiconductor material, for example silicon, and is disposed on a mounting, which is also referred to as a wafer stage WS.

In the present example, the projection lens 20 has six reflective optical elements 21 to 26 (mirrors) in order to generate an image of the structure that is present at the structured object M on the wafer W. The number of mirrors in a projection lens 20 is typically between four and eight; optionally, however, it is also possible to use only two mirrors or else ten mirrors.

The collector mirror 6, the reflective optical elements 12 to 16 of the illumination system 10 and the reflective optical elements 21 to 26 of the projection lens 20 are arranged in a vacuum environment. In this case, a respective optical element 6, 12 to 16, 21 to 26 is typically arranged in a dedicated vacuum housing, also referred to as "mini environment".

By way of example, FIG. 1 illustrates such a vacuum housing 27, in which the first reflective optical element 12 of the illumination system 10 is arranged. The illumination beam path 7 enters the vacuum housing 27 at an intermediate focus F and emerges from the vacuum housing 27 at a further opening (not illustrated in the figures) in the direction of the second optical element 13 of the illumination system 10. A plurality of the optical elements 12 to 16, 21 to 26 can also be arranged in a respective vacuum housing. The entire EUV lithography apparatus 1 shown in FIG. 1 is additionally surrounded by a (vacuum) housing, not illustrated, in the interior of which the vacuum housing 27 is arranged. The vacuum housing 27 acts in the manner of a shield and is assigned a contamination reducing unit (not illustrated in the figures), which reduces the partial pressure of contaminating substances at least in direct proximity to an optical surface 12a of the optical element 12 relative to the partial pressure of the contaminating substances in the interior of the EUV lithography apparatus 1 surrounding the vacuum housing 27. With regard to the configuration of the "mini environment", reference should also be made to WO 2008/034582 A2.

The EUV lithography apparatus 1 shown in FIG. 1 is designed for an operating wavelength $\lambda_B$ of the EUV radiation 5 of 13.5 nm. However, it is also possible for the EUV lithography apparatus 1 to be configured for a different operating wavelength $\lambda_B$ in the EUV wavelength range, such as 6.8 nm, for example.

Figure 2A:
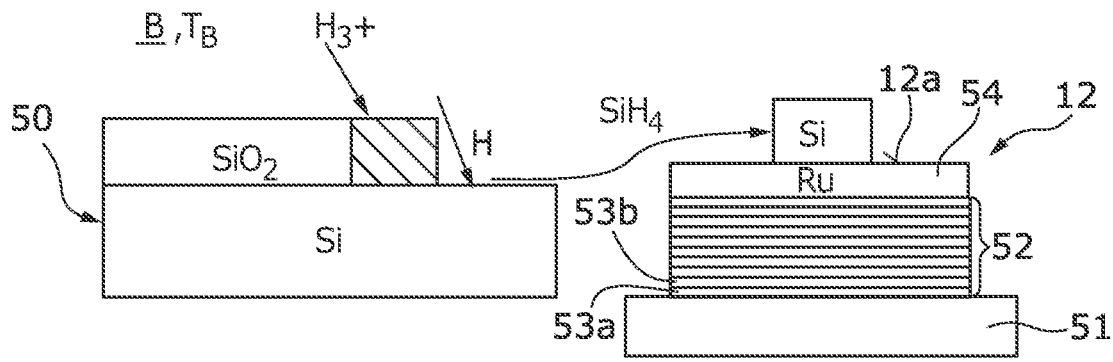
FIG. 2A shows a schematic illustration of a component that outgasses contaminants.

FIG. 2A shows the reflective optical element 12 from FIG. 1 and also a further component 50, which is likewise arranged in the vacuum housing 27 shown in FIG. 1 and contains silicon (Si). The silicon-containing component 50 can be for example a sensor, an actuator, . . . , but also a (further) optical element comprising a substrate containing Si, e.g. a substrate composed of quartz glass, in particular composed of titanium-doped quartz glass (ULE®), or composed of a glass ceramic.

The optical element 12 likewise comprises a substrate 51 composed of titanium-doped quartz glass, to which is applied a reflective multilayer coating 52 optimized for the reflection of EUV radiation 5 at the operating wavelength $\lambda_B$ of 13.5 nm. The multilayer coating 52 comprises alternating layers 53a, 53b of molybdenum and silicon. At the operating wavelength $\lambda_B$ of 13.5 nm, the silicon layers 53b have a higher real part of the refractive index than the molybdenum layers 53a. Depending on the exact value of the operating wavelength $\lambda_B$, other material combinations, such as e.g. molybdenum and beryllium, ruthenium and beryllium, or lanthanum and $B_4C$, are likewise possible. In order to protect the multilayer coating 52, a protective layer 54 of ruthenium is applied to it.

During the exposure operating mode B, in which the structured object M or a respective partial region thereof is imaged onto the substrate W, a native $SiO_2$ layer at the surface of the component 50 is reduced to Si upon contact with ionic hydrogen species $H_3^+$. The ionic hydrogen species $H_3^+$ are constituents of a reducing plasma 43 formed in the vacuum housing 27 as a result of the interaction of a residual gas 40 present in the vacuum housing 27, said residual gas being shown in FIG. 3, with the EUV radiation 5. Besides $H_3^+$, the reducing hydrogen plasma 43 also has other ionic constituents (e.g. $H_2^+$) and radical hydrogen species (e.g. H).

As a result of the attack of radical hydrogen species H from the plasma 43, gaseous silane ($SiH_4$) forms from the silicon in accordance with the following reaction equation:

$$Si\ (s) + 4H\ (g) \rightarrow SiH_4\ (g)$$

At the surface 12a of the reflective optical element 12, corresponding to the surface of the Ru protective layer, degradation occurs on account of the accumulation of silicon:

$$SiH_4\ (g) + Ru\ (s) \rightarrow Si\text{---}Ru\ (s) + 2H_2\ (g).$$

Figure 2B:
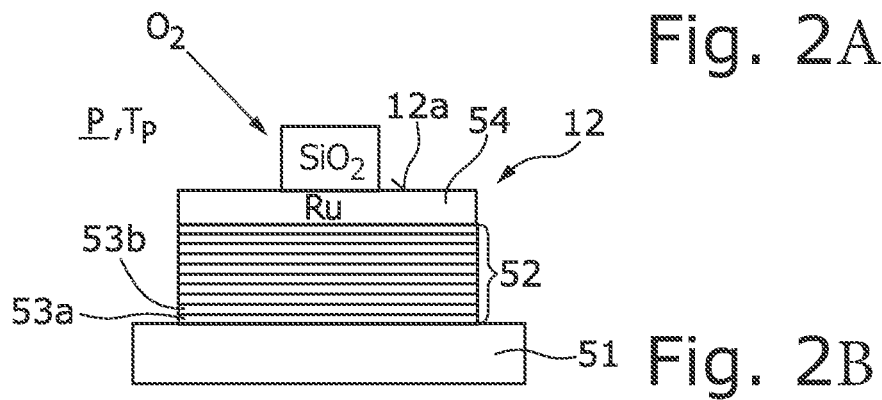
FIG. 2B shows a schematic illustration of a reflective optical element at which oxidized contaminants are formed in an exposure pause.

During an exposure pause P (cf. FIG. 2B), during which no EUV radiation 5 is radiated into the vacuum housing 27, and so no reducing plasma 43 arises there, the reaction of oxygen contained in the vacuum housing 27 results in subsequent oxidation and the formation of $SiO_2$ as an oxidized contaminant:

$$Si\text{---}Ru\ (s) + 2O(g) \rightarrow SiO_2(s) + Ru(s)$$

The presence of the oxidized contaminant in the form of silicon oxide ($SiO_2$) at the surface 12a of the reflective optical element 12 results in a considerably greater reflectivity loss and thus a reduced transmission $T_P$ of the EUV lithography apparatus 1 after the exposure pause P. The reflectivity loss that arises as a result of the presence of the oxidized contaminant ($SiO_2$) is significantly greater than the reflectivity loss that arises as a result of the presence of the non-oxidized contaminant in the form of silicon (Si) that is present at the surface 12a of the reflective optical element 12 in the exposure operating mode B before the operating pause P.

Accordingly, the transmission $T_B$ (cf. FIG. 2A) of the EUV lithography apparatus 1 before the operating pause P is greater than the transmission $T_P$ (cf. FIG. 2B) of the EUV lithography apparatus 1 after the operating pause P. If the EUV lithography apparatus 1 is operated in the exposure operating mode B again after the operating pause P and EUV radiation 5 is radiated into the vacuum housing 27, the transmission T increases proceeding from the transmission $T_P$ after the operating pause since a portion of the oxidized contaminants, e.g. $SiO_2$, is reduced to Si on account of the reducing plasma 43 generated upon the interaction with the EUV radiation 5. It generally holds true that contaminants such as Si, Sn, etc. cannot be removed or can be removed only with extreme difficulty from the surface 12a of the reflective optical element 12, and so the transmission T of the EUV lithography apparatus 1 basically decreases in the course of the lifetime thereof. The transmission loss $T_B - T_P$ attributable to the operation of the EUV lithography apparatus 1 during the operating pause P or to the oxidation of the contaminants Si, Sn is reversible for the most part, however, i.e. the transmission $T_B$ before the operating pause P can be recovered (for the most part) during a renewed exposure operating mode B following the operating pause P.

The time duration until the—at least partial—recovery of the transmission $T_B$ in the renewed exposure operating mode B can be a number of days, however, particularly in the case of the reflective optical elements 21 to 26 of the projection system 20. In order to accelerate the recovery of the transmission $T_B$, the EUV lithography apparatus 1 is operated in a recovery operating mode R, which is described in greater detail below with reference to FIG. 3 and FIG. 4. In the recovery operating mode R the reducing effect on the oxidized contaminants, e.g. on $SiO_2$, is greater than in the exposure operating mode B, i.e. the transmission $T_B$ before the exposure pause P is recovered in an accelerated manner by comparison with the exposure operating mode B.

In order to accelerate the reduction of the oxidized contaminants, e.g. $SiO_2$, various measures can be carried out individually or in combination, a number of which measures are described by way of example below.

Figure 3:
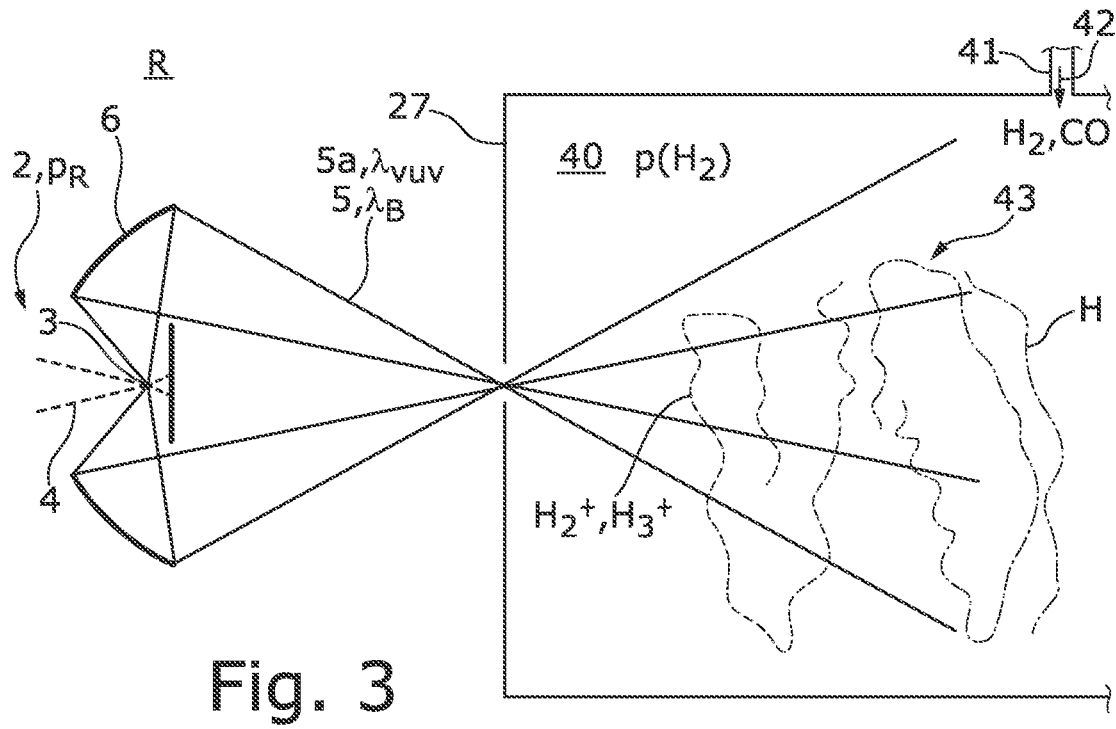
FIG. 3 shows a schematic illustration of a recovery operating mode of the EUV lithography apparatus, in which, in order to recover the transmission, EUV radiation and additionally VUV radiation are radiated into a vacuum housing.

In the example shown in FIG. 3, EUV radiation 5 is radiated into the vacuum housing 27 in order to generate a reducing plasma 43 in the vacuum housing 27 and thus at the surface 12a of the reflective optical element 12 in the recovery operating mode R analogously to the exposure operating mode B. In order to increase the reducing effect, radiation 5a at at least one wavelength or in a wavelength range $\lambda_{VUV}$ outside the EUV wavelength range, which is between 5 nm and 30 nm, is additionally radiated into the vacuum housing 27. The additional radiation 5a has at least one wavelength $\lambda_{VUV}$ which is greater than 30 nm and which generally is not more than approximately 250 nm, i.e. the at least one wavelength $\lambda_{VUV}$ lies in the VUV wavelength range.

The additional radiation 5a intensifies the photoionization or the excitation of gas constituents present in the residual gas 40, and thus the effect of the reducing plasma 43. The additional radiation 5a can be generated by a dedicated (VUV) light source (not illustrated). In the example shown, the additional radiation 5a is generated by the EUV light source 2 itself: In the case of the EUV light source 2 embodied as a plasma light source as described here, a proportion of radiation 5a is generated at wavelengths outside the EUV wavelength range anyway. This proportion in the spectrum of the EUV light source 2 that is not in the EUV wavelength range can be amplified by suitably modifying the beam profile of the laser beam 4 used to generate the tin plasma.

Additionally or alternatively it is possible, in the recovery operating mode R, to operate the EUV light source 2 with a power $p_R$ that is greater than the power $p_B$ of the EUV light source 12 in the exposure operating mode B. As a result of the greater power $p_R$, the reducing effect of the plasma 43 likewise increases.

In order to increase the reducing effect on the reflective optical elements 21 to 26 arranged in the projection system 20, the mask M used for the exposure operating mode B can be exchanged for a highly reflective mask RM in the recovery operating mode R (cf. FIG. 1). The highly reflective mask has no absorbing structures and thus has a reflectivity for the EUV radiation 5 which is comparable with the reflectivity of the other reflective optical elements in the EUV lithography apparatus 1 and which is more than approximately 60%. Through a suitable choice of the material or materials of the protective layer or protective layer system of the highly reflective mask RM, the reflectivity of the highly reflective mask RM can additionally also be increased for further radiation 5a outside the EUV wavelength range, in particular in the VUV wavelength range.

While specific constituents of the residual gas 40 are present in small amounts in the vacuum housing 27 anyway, other constituents serving as purge gases 42, in particular molecular hydrogen ($H_2$), are fed to the vacuum housing 27 via a feed device 41 in the form of a tubular gas feed. By way of a controllable valve or the like, the feed device 41 can control the flow of the purge gas or the flow of the individual constituents of the purge gas 42 by open-loop control or optionally closed-loop control.

A further possibility for intensifying the effect of the reducing plasma 43 consists in increasing a partial pressure of at least one gas constituent of the residual gas 40 in the vacuum housing 27 in the recovery operating mode R relative to a partial pressure in the exposure operating mode B. By way of example, the partial pressure p($H_2$) of molecular hydrogen $H_2$ in the vacuum housing 27 can be increased during the recovery operating mode R by driving the feed device 41 in a suitable manner. In the recovery operating mode R, additional reducing gases that are otherwise not present in the residual gas 40 in the vacuum housing 27 can also be admitted into the vacuum housing 27. The additional reducing gas can be CO, for example, as is indicated in FIG. 3.

The measures described further above relating to the feed of the purge gas 42 can also be carried out during the operating pause P, particularly if the EUV lithography apparatus 1 is not ventilated during the operating pause P.

The measures described below in association with FIG. 4 can also be carried out during the recovery operating mode R and/or during the exposure pause P.

Figure 4:
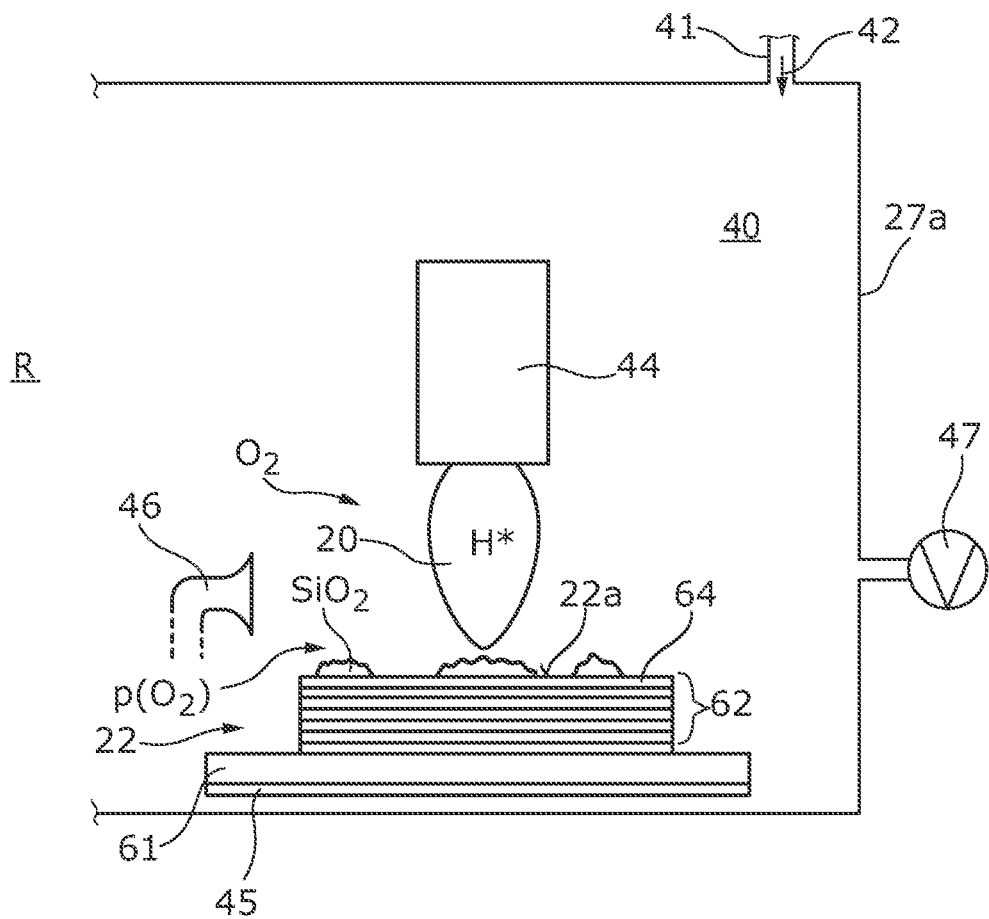
FIG. 4 shows a schematic illustration of a recovery operating mode of the EUV lithography apparatus, in which use is made of a plasma generating device for generating activated hydrogen in order to recover the transmission.

FIG. 4 shows the second optical element 22 of the projection system 20, which is embodied like the optical element 12 shown in FIGS. 2A, B. The optical element 22 in FIG. 4 comprises a substrate 61 composed of titanium-doped quartz glass, to which is applied a reflective multilayer coating 62 optimized for the reflection of EUV radiation 5 at the operating wavelength $\lambda_B$ of 13.5 nm. To protect the multilayer coating 62, a protective layer 64 of ruthenium is applied to it.

The optical element 22 is arranged in a vacuum housing 27a, into which purge gases 42 can be fed via a feed line 41. A residual gas 40 is situated in the vacuum housing 27a. A plasma generating device 44 is also arranged in the vacuum housing 27a, said plasma generating device being used to generate reducing gas species, here in the form of activated or atomic hydrogen H* or hydrogen radicals. In the example shown, the plasma generating device 44 forms a cleaning head embodied as described in WO 2008/034582 A2. In the example shown, the plasma generating device 44 can be moved within the vacuum housing 27a and in the process can be positioned over the surface 22a of the reflective optical element 22, as is illustrated in FIG. 4.

In the example illustrated in FIG. 4, the plasma generating device 44 in the form of the cleaning head is activated during the recovery operating mode R in order to reduce oxidized contaminants, e.g. in the form of $SiO_2$, with the aid of the activated hydrogen H*. The use of activated hydrogen H* has proved to be advantageous vis-à-vis the use of hydrogen ions $H_2^+$, $H_3^+$, etc., in the case of specific oxidized contaminants, e.g. in the case of $RuO_x$. However, the plasma generating device 44 can also be embodied in a different way and generate for the most part hydrogen ions, e.g. $H_2^+$, $H_3^+$, etc., or other ionic gas species, which are typically directed in the form of a gas flow onto the surface 22a of the reflective optical element 22. By way of a movement of the plasma generating device 44 relative to the surface 22a of the reflective optical element 22, oxidized contaminants formed locally, e.g. $SiO_2$, etc., can also be chemically reduced in a targeted manner. By way of example, a device that ignites a gas discharge in the residual gas 40 of the vacuum housing 27a can also serve as plasma generating device 44.

The plasma generating device 44 can remain activated during the entire time duration of the recovery operating mode R, but it is also possible for the plasma generating device 44 to be active only for one part of the time duration of the recovery operating mode R and for the EUV radiation 5 to be radiated into the vacuum housing 27a during another part of the time duration of the recovery operating mode R. If the plasma generating device 44 is positioned suitably relative to the optical element 22, radiating in the EUV radiation 5 and activating the plasma generating device 44 can also be effected simultaneously.

In order to increase the reactivity of the reduction reactions at the surface 22a of the reflective optical element 22, the reflective optical element 22 is heated with the aid of a temperature-regulating device 45, for example in the form of a Peltier element, during the recovery operating mode R.

Particularly during an exposure pause P, but optionally also during the recovery operating mode R, at least one purge device 46 can be activated in order to reduce a partial pressure p($O_2$) of oxidizing species, e.g. in the form of oxygen $O_2$, in the region of the surface 22a of the reflective optical element 22. The purge device 46 can generate for example a gas flow of an inert gas, e.g. of a noble gas, which is guided along the surface 22a of the reflective optical element 22 and protects the surface 22a, or the not yet oxidized contaminants that have deposited there, against oxidizing species in the residual gas 40.

Particularly during an exposure pause P, but optionally also during the recovery operating mode R, at least one pump device 47 can be activated in order to reduce the concentration of oxidizing species, in particular of molecular oxygen, in the vacuum housing 27a. The pump device 47 can be a cryopump or a getter pump, for example.

The EUV lithography apparatus 1 comprises a control device 48 (cf. FIG. 1), which can be embodied as a microprocessor, a microcontroller or as a control computer, for example, and which is configured or programmed to control the EUV lithography apparatus 1 in the exposure operating mode B and in the recovery operating mode R and optionally also during the exposure pause P. For this purpose, the control device 48 is connected to all the assemblies of the EUV lithography apparatus 1 which are relevant to the control, for example to the EUV light source 2 in order if necessary to vary the emission spectrum thereof, to the plasma generating device 44, to a transport device for exchanging the mask M for the highly reflective mask RM, etc.

The control device 48 is also configured to define a time duration $\Delta t_R$ of the recovery operating mode R depending on a transmission loss $T_B - T_R$ of the EUV lithography apparatus 1 during the exposure pause P. The transmission loss $T_B - T_R$ occurs between the beginning and the end of the exposure pause P. In order to define the time duration $\Delta t_R$ of the recovery operating mode R, the control device 48 can have recourse to measurement values known in advance or determined experimentally, which optionally take account of a time duration of the exposure pause P. The measurement values for the transmission loss can be stored for example in the form of a table in a control device 48 of the EUV lithography apparatus 1. Suitable (power) sensors can be used for the measurement of the transmission $T_B$ during the exposure operating mode B and respectively the measurement of the transmission $T_R$ during the recovery operating mode R. The time duration $\Delta t_R$ of the recovery operating mode R is generally chosen to be all the longer, the greater the transmission loss, i.e. the greater the difference $T_B - T_R$ during the exposure pause P.

The time duration $\Delta t_R$ of the recovery operating mode R can optionally be reduced further if, in addition to the measured transmission loss $T_B - T_R$, that proportion of the transmission loss $T_B - T_R$ is known which is attributable to the oxidation of contaminants at the surface 12a, 22a of a respective reflective optical element 12, 22. The time duration $\Delta t_R$ of the recovery operating mode R can also be reduced if the composition of the residual gas 40 and the excitation of the plasma 43 are defined or optimized depending on the components 50 which outgas contaminants in the vicinity of a respective reflective optical element 12, 22 and/or depending on the type of a contaminant that has respectively deposited on the surface 12a, 22a of the reflective optical element 12, 22.

What is claimed is:

1. Method for operating an extreme ultraviolet (EUV) lithography apparatus having at least one vacuum housing in which at least one reflective optical element is arranged, comprising:
   operating the EUV lithography apparatus in an exposure operating mode (B), in which EUV radiation is radiated into the vacuum housing, wherein a reducing plasma is generated at a surface of the reflective optical element in response to an interaction of the EUV radiation with a residual gas present in the vacuum housing,
   after an exposure pause (P), in which no EUV radiation is radiated into the vacuum housing, and before a renewed operation of the EUV lithography apparatus in the exposure operating mode (B), operating the EUV lithography apparatus in a recovery operating mode (R), in which contaminants at the surface of the reflective optical element that are deposited permanently on the surface of the reflective optical element are reduced from an oxidized state to a non-oxidized state, the non-oxidized state bringing about a lower reflectivity loss compared with the oxidized state, thereby recovering, at least in part, a transmission of the EUV lithography apparatus before the exposure pause (P).

2. Method according to claim 1, wherein at least one component which outgasses contaminants upon contact with the reducing plasma in the exposure operating mode (B) is arranged in the vacuum housing, wherein the contaminants accumulate at the surface of the reflective optical element and form oxidized contaminants during the exposure pause (P).

3. Method according to claim 1, further comprising, in the recovery operating mode (R), radiating EUV radiation generated by an EUV light source into the vacuum housing, thereby generating a reducing plasma in the vacuum housing.

4. Method according to claim 3, further comprising exchanging a mask used in the exposure operating mode (B) for a more highly reflective mask in the recovery operating mode (R).

5. Method according to claim 3, wherein a power of the EUV light source in the recovery operating mode (R) is increased relative to a power of the EUV light source in the exposure operating mode (B).

6. Method according to claim 1, further comprising, in the recovery operating mode (R), radiating radiation at at least one wavelength outside the EUV wavelength range into the vacuum housing.

7. Method according to claim 6, wherein the radiation outside the EUV wavelength range is generated by an EUV light source of the EUV lithography apparatus.

8. Method according to claim 6, further comprising exchanging a mask used in the exposure operating mode (B) for a more highly reflective mask in the recovery operating mode (R).

9. Method according to claim 6, wherein a power of the EUV light source in the recovery operating mode (R) is increased relative to a power of the EUV light source in the exposure operating mode (B).

10. Method according to claim 1, wherein, in the exposure pause (P) and/or in the recovery operating mode (R), at least one partial pressure of a gas constituent of the residual gas that forms the reducing plasma is increased.

11. Method according to claim 10, wherein, in the exposure pause (P) and/or in the recovery operating mode (R), the increased partial pressure is a partial pressure of molecular hydrogen.

12. Method according to claim 1, wherein, in the exposure pause (P) and/or in the recovery operating mode (R), at least one additional gas that forms a reducing plasma is fed to the residual gas.

13. Method according to claim 12, wherein the at least one additional gas that forms a reducing plasma is carbon monoxide.

14. Method according to claim 1, further comprising heating the at least one reflective optical element in the exposure pause (P) and/or in the recovery operating mode (R).

15. Method according to claim 1, further comprising, in the exposure pause (P) and/or in the recovery operating mode (R), activating at least one plasma generating device, thereby generating a reducing gas species.

16. Method according to claim 15, wherein, in the exposure pause (P) and/or in the recovery operating mode (R), the reducing gas species comprises hydrogen ions.

17. Method according to claim 1, further comprising, during the exposure pause (P) and/or during the recovery operating mode (R), activating at least one purge device, thereby reducing a partial pressure of oxidizing species in a region of the surface of the reflective optical element.

18. Method according to claim 1, further comprising, during the exposure pause (P) and/or during the recovery operating mode (R), activating at least one pump device, thereby reducing a concentration of oxidizing species in the vacuum housing.

19. Method according to claim 1, further comprising measuring the transmission of the EUV lithography apparatus during the exposure operating mode (B) and/or during the recovery operating mode (R).

20. Method according to claim 1, further comprising determining a time duration of the recovery operating mode (R) depending on a transmission loss of the EUV lithography apparatus during the exposure pause (P).

21. Extreme ultraviolet (EUV) lithography apparatus, comprising:
   at least one vacuum housing in which at least one reflective optical element is arranged,
   a control device configured to operate the EUV lithography apparatus in an exposure operating mode (B), in which EUV radiation is radiated into the vacuum housing, wherein a reducing plasma is generated at a surface of the reflective optical element in response to an interaction of the EUV radiation with a residual gas present in the vacuum housing,
   wherein the control device is configured, in accordance with computer-readable instructions, after an exposure pause (P), in which no EUV radiation is radiated into the vacuum housing, and before renewed operation of the EUV lithography apparatus in the exposure operating mode (B), to operate the EUV lithography apparatus in a recovery operating mode (R), in which contaminants at the surface of the reflective optical element that are deposited permanently on the surface of the reflective optical element are reduced from an oxidized state to a non-oxidized state, the non-oxidized state bringing about a lower reflectivity loss compared with the oxidized state, thereby recovering, at least in part, a transmission of the EUV lithography apparatus before the exposure pause (P).

* * * * *